(12) United States Patent
Roux (10) Patent No.: US 7,853,067 B2
(45) Date of Patent: Dec. 14, 2010

(54) SYSTEMS AND METHODS FOR LITHOGRAPHIC RETICLE INSPECTION

(75) Inventor: Stephen Roux, New Fairfield, CT (US)

(73) Assignee: ASML Holding N.V., Veldhoven (NL)

(*) Notice: Subject to any disclaimer, the term of this patent is extended or adjusted under 35 U.S.C. 154(b) by 931 days.

(21) Appl. No.: 11/588,281

(22) Filed: Oct. 27, 2006

(65) Prior Publication Data

US 2008/0101684 A1 May 1, 2008

(51) Int. Cl.
*G06K 9/62* (2006.01)
(52) U.S. Cl. ...................................... 382/144
(58) Field of Classification Search .................. 382/144
See application file for complete search history.

(56) References Cited

U.S. PATENT DOCUMENTS

| | | | |
|---|---|---|---|
| 5,536,559 A | 7/1996 | Cerrina et al. | |
| 5,544,213 A | 8/1996 | Chiba et al. | |
| 5,675,403 A | 10/1997 | Cerrina et al. | |
| 6,091,845 A * | 7/2000 | Pierrat et al. | 382/144 |
| 6,934,005 B2 | 8/2005 | Roux et al. | |
| 7,010,958 B2 | 3/2006 | Gajdeczko et al. | |
| 2001/0026358 A1 | 10/2001 | Van Dijsseldonk | |
| 2002/0081498 A1 | 6/2002 | Ehrmann | |
| 2003/0048939 A1* | 3/2003 | Lehman | 382/144 |
| 2004/0013956 A1 | 1/2004 | Sogard | |
| 2004/0041102 A1 | 3/2004 | Kamm | |
| 2005/0274173 A1 | 12/2005 | Eber et al. | |
| 2006/0016247 A1 | 1/2006 | Galburt et al. | |
| 2007/0048627 A1* | 3/2007 | Hickman | 430/5 |

FOREIGN PATENT DOCUMENTS

| | | |
|---|---|---|
| DE | 102004010002 A1 | 9/2005 |
| EP | 1396757 A2 | 3/2004 |
| JP | 2005243710 A | 9/2005 |

* cited by examiner

*Primary Examiner*—Brian P Werner
(74) *Attorney, Agent, or Firm*—Sterne, Kessler, Goldstein & Fox P.L.L.C.

(57) ABSTRACT

Systems and methods for inspection of lithographic reticles are provided. The method begins with the generation of a topographical map for a reticle surface with the reticle being in a load-free state. The reticle is then loaded onto a reticle chuck in a lithographic apparatus. A topographical map is then generated for the loaded reticle. The topographical maps for the reticle in a load-free and loaded state are then compared to generate differences. Based on these differences a control action is taken, which can include approving use of the reticle, rejecting the reticle use or applying forces to the reticle to compensate for the topography differences. In an embodiment, the method occurs in situ in that at least the generation of the loaded-state topography occurs within a lithographic apparatus during a wafer run (or other type of run). A lithographic reticle inspection system and a reticle inspection analyzer are also disclosed.

19 Claims, 9 Drawing Sheets

SYSTEMS AND METHODS FOR LITHOGRAPHIC RETICLE INSPECTION

BACKGROUND OF THE INVENTION

1. Field of the Invention

The present invention relates to lithography, more particularly, to providing systems and methods for advanced lithographic reticle inspection.

2. Related Art

Lithography is a process used to create features on the surface of substrates. Such substrates can include those used in the manufacture of flat panel displays (e.g., liquid crystal displays), semiconductor wafers, circuit boards, various integrated circuits, print heads, macro/nano-fluidic substrates, and the like. During lithography, a substrate, which is disposed on a substrate stage, is exposed to an image projected onto the surface of the substrate by exposure optics through the use of a patterning device, such as a reticle, located within a lithography apparatus.

The projected image produces changes in the characteristics of a layer, for example, photoresist, deposited on the surface of the substrate. These changes correspond to the features projected onto the substrate during exposure. Subsequent to exposure, the layer can be etched or otherwise processed to produce a patterned layer. The pattern corresponds to those features projected onto the substrate during exposure. The patterned layer is then used to remove or further process exposed portions of underlying structural layers within the substrate, such as conductive, semiconductive, or insulative layers. This process is repeated, together with other steps, until the desired features have been formed on the surface, or in various layers, of the substrate.

Reticles, which can also be referred to as masks, are created in mask houses from high quality blanks. They are inspected for pattern accuracy and defects. Once deemed good they are put into service where they are typically inspected again to ensure that they are free of particles. Nonetheless, substrate errors occur due to patterning errors attributable to reticles. In particular, reticles are being distorted out of their ideal shape, which leads to inaccurate pattern transfer.

Reticles can be distorted, for example, as they are mounted onto a reticle stage. The distortion manifests itself as an error in printing on a wafer either due to focus, telecentricity, pattern distortion or induced retardation. As a result, reticles can have varying stress birefringence and thereby impact printing on the wafer, especially on machines where the illumination is polarized. These reticles will nominally have acceptable levels of birefringence when made, but may not stay in an acceptable state on the reticle stage. The problem is exacerbated by the need to clamp the reticle very firmly to the stage to avoid slipping during high G acceleration in newer and increasingly faster lithographic machines. Additionally, during the loading process a particle could get trapped between a reticle and a reticle chuck, which could also lead to pattern distortions caused by the reticle.

What are needed are systems and in situ methods for advanced reticle inspection that can identify unwanted distortions in the reticles when they are mounted onto a reticle stage.

SUMMARY OF THE INVENTION

The present invention is directed to systems and methods for inspection of lithographic reticles. A method for lithographic reticle inspection is provided. The method begins with the generation of a topographical map for a reticle surface with the reticle being in a load-free state. The reticle is then loaded on to a reticle chuck in a lithographic apparatus. A topographical map is then generated for the loaded reticle. The topographical maps for the reticle in a load-free and loaded state are then compared to generate differences between the topographies. Based on these a control action is taken. Control actions can include, but are not limited to, approving use of the reticle, rejecting the reticle use, or applying forces to the reticle to compensate for the topography differences. In an embodiment, the method occurs in situ in that at least the generation of the loaded-state topography occurs within a lithographic apparatus during a wafer run (or other type of run).

A lithographic reticle inspection system is also disclosed. The lithographic reticle inspection system includes a reticle positioning device that positions a reticle and a mapping device that maps the topography of a reticle surface. The reticle inspection system further includes a reticle inspection analyzer. The reticle inspection analyzer includes a reticle topography mapper and a reticle topography comparator. In other embodiments the reticle inspection analyzer includes a reticle adjustment module and a reticle topography database. The reticle topography mapper generates a topographical map for a reticle based on measurements from the mapping device. The reticle topography comparator compares a topography of a reticle in a first state and a topography of the reticle in a second state. The comparator determines whether to take a control action based on the comparison of the topography of the reticle in the first state and a topography of the reticle in the second state. In an embodiment the first state is a load-free state and the second state is a loaded state. In another embodiment the first state is a theoretical state, and the second state is a loaded state.

Further embodiments, features, and advantages of the present invention, as well as the structure and operation of the various embodiments of the present invention are described in detail below with reference to accompanying drawings.

BRIEF DESCRIPTION OF THE FIGURES

The present invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
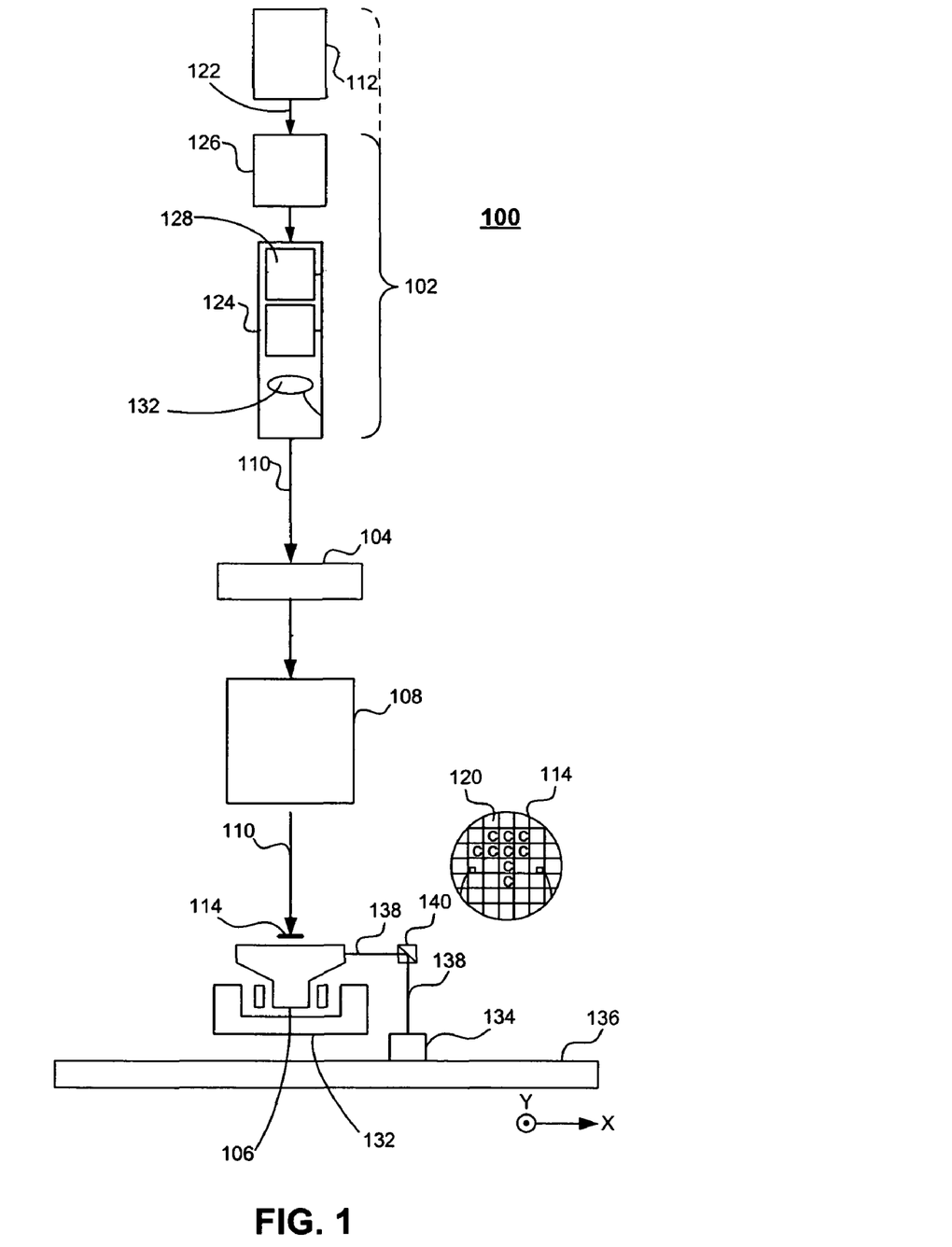
FIG. 1 is a block diagram of a lithography system.

FIG. 1 provides a diagram of lithographic apparatus 100, according to an embodiment of the invention. Lithographic apparatus 100 includes at least a radiation system 102, reticle 104, an object table 106 (e.g., a substrate table), and an projection system 108.

Radiation system 102 can be used for supplying a projection beam 110 of radiation (e.g., UV radiation), which in this particular case also comprises a radiation source 112.

Reticle 104 can be used for applying a pattern to projection beam 110. In general, the position of reticle 104 can be fixed relative to projection system 108. However, in an alternative arrangement, reticle 104 may be connected to a positioning device (not shown) for accurately positioning it with respect to projection system 108. A reticle handler (not shown) can be coupled to the positioning device for obtaining a reticle from a reticle pod (not shown) within or coupled to lithographic apparatus 100. The reticle pod stores reticles for use within a lithographic apparatus.

Object table 106 can be provided with a substrate holder (not specifically shown) for holding a substrate 114 (e.g., a resist coated silicon wafer or glass substrate) and object table 106 can be connected to a positioning device (not shown) for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam onto a target portion 120 (e.g., one or more dies) of substrate 114. Projection system 108 may project an image of reticle 104 onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on reticle 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Having been patterned by reticle 104, beam 110 passes through projection system 108, which focuses beam 110 onto a target portion 120 of the substrate 114.

With the aid of positioning device (and optionally interferometric measuring device 134 on a base plate 136 that receives interfereometric beams 138 via beam splitter 140, or optionally encoders that are used to provide position detection), substrate table 106 can be moved accurately, so as to position different target portions 120 in the path of beam 110. Where used, the positioning device for the reticle 104 can be used to accurately correct the position of reticle 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position reticle 104. It will be appreciated that projection beam 110 may alternatively/additionally be moveable, while object table 106 and/or reticle 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography. Combinations and/or variations on the above described modes of use or entirely different modes of use may also be employed.

Figure 2:
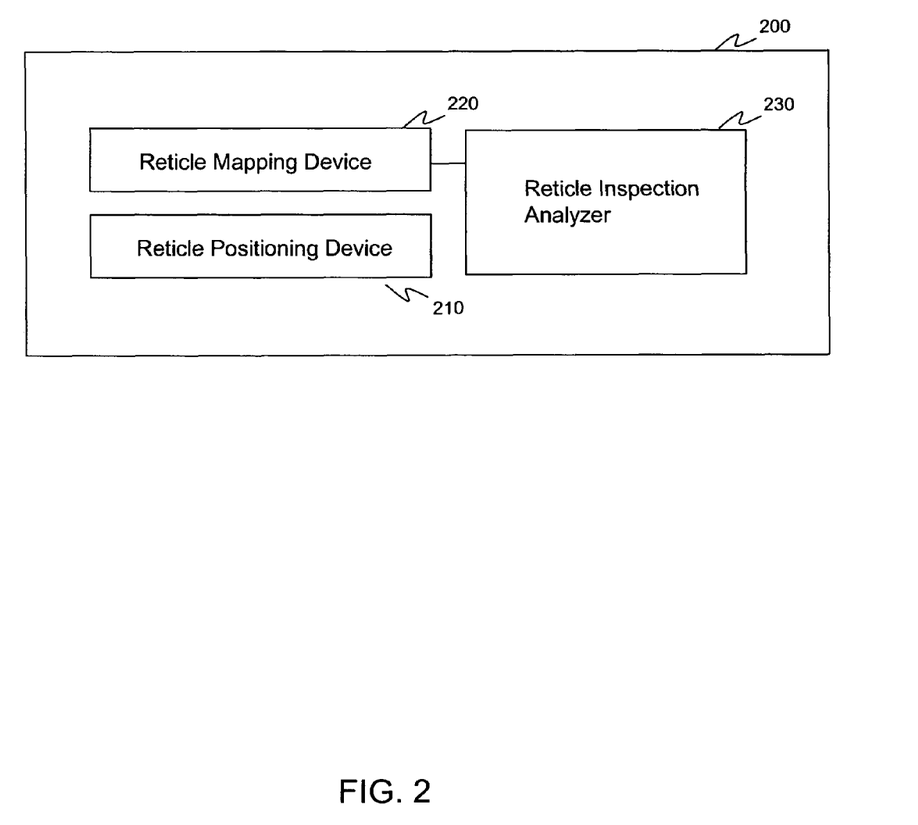
FIG. 2 provides a diagram of lithographic reticle inspection system, according to an embodiment of the invention.

FIG. 2 provides a high-level block diagram of lithographic reticle inspection system 200, according to an embodiment of the invention. Lithographic reticle inspection system 200 includes reticle positioning device 210, reticle mapping device 220, and reticle inspection analyzer 230.

Figure 6:
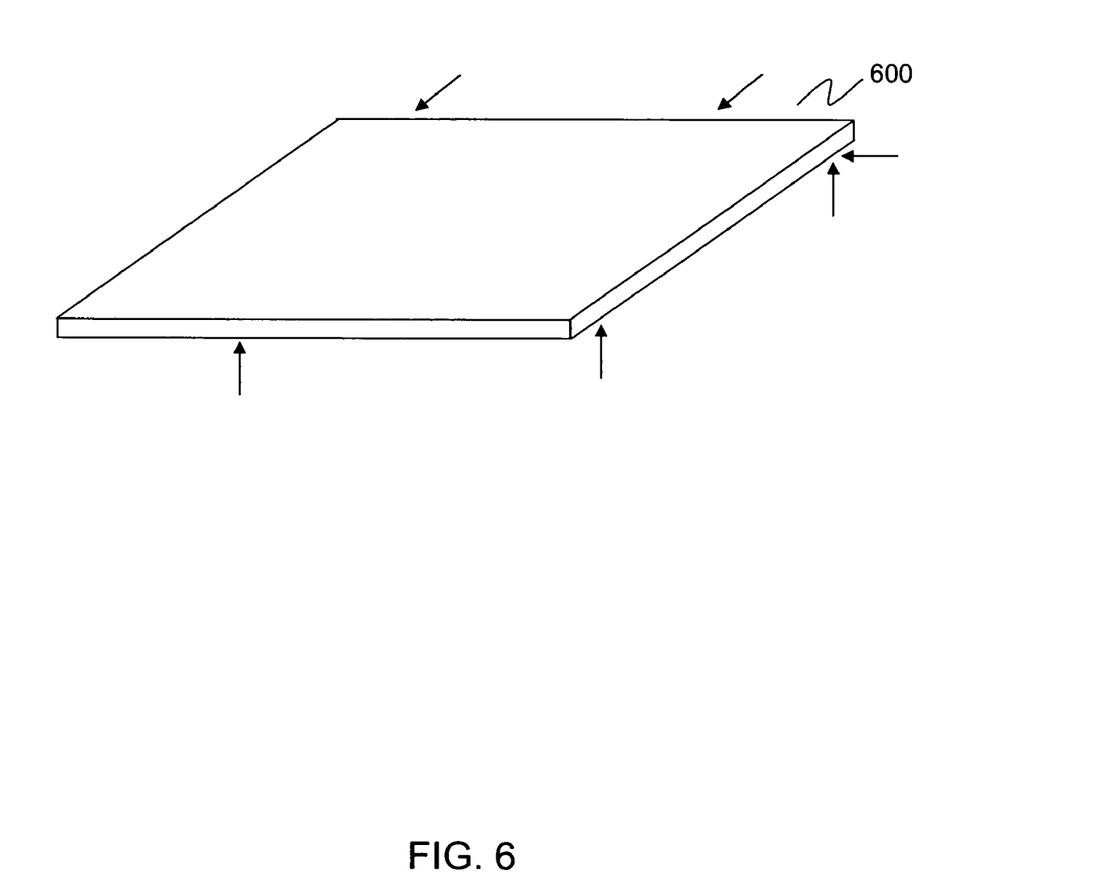
FIG. 6 provides a diagram of a reticle constrained kinematically.

Reticle positioning device 210 positions a reticle in a load-free manner. Reticle positioning device 210 can include different types of devices to position a reticle, as will be known by individuals skilled in the relevant arts. These devices include, but are not limited to, air bearings, a bed of small springs or a kinematic three point mount, similar to that used in a reticle writing e-beam system, as will be known by individuals skilled in the relevant arts. For example, FIG. 6 depicts reticle 600 having forces in three directions to position reticle 600.

Reticle mapping device 220 maps the topography of a reticle surface.

Figure 7A:
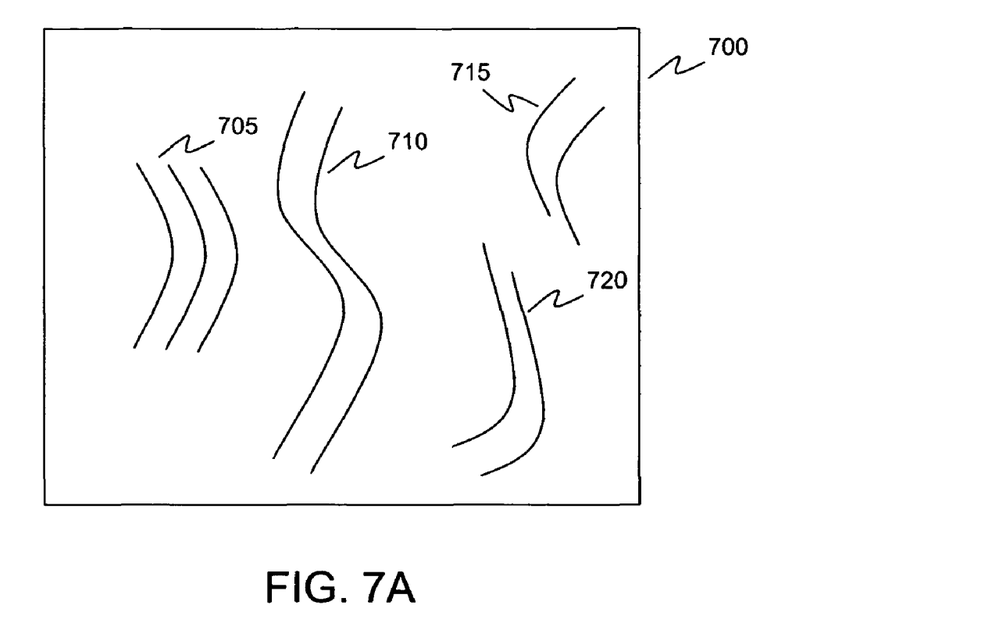
FIG. 7A provides a topographical map of a reticle surface in a load-free state, according to an embodiment of the invention.

An exemplary topography is shown in FIG. 7A. FIG. 7A provides a topography map 700 having topography patterns 705, 710, 715, and 720, which highlight elevations and gradients on the surface of a reticle. Reticle mapping device 220 can include different types of devices to map the surface of the reticle. These include, but are not limited to, an air gauge, an air gauge array, an optical sensor, an interferometer, and the like.

An exemplary air gauge is described in U.S. Pat. No. 7,010,958, entitled High Resolution Gas Gauge Proximity Sensory, which is incorporated herein in its entirety. Surface mapping using an air gauge or air gauge array occurs on the reticle side opposite a pellicle. For example, referring to FIG. 8 metrology device 840, which could be an air gauge or air gauge array maps the surface of reticle 810 on the side opposite from pellicle 820.

Figure 8:
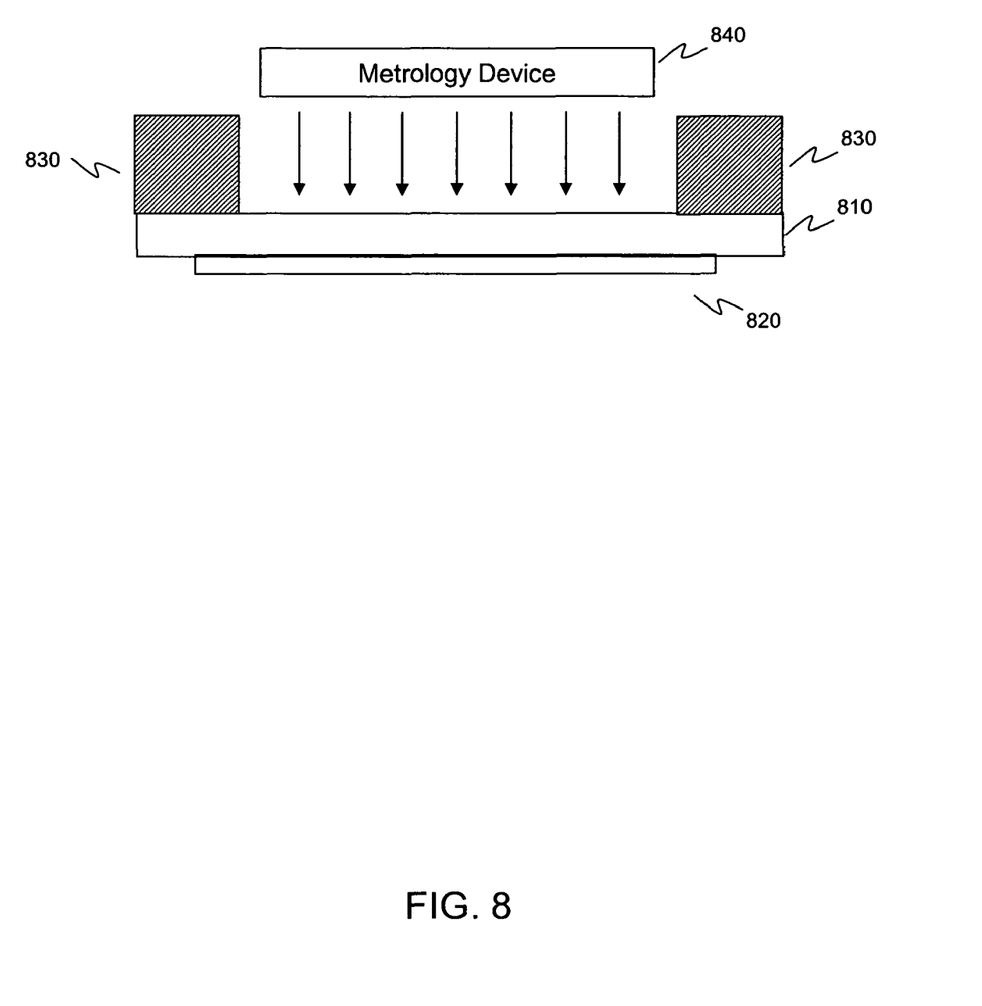
FIG. 8 provides a diagram of a reticle loaded into a lithographic apparatus, according to an embodiment of the invention.

Alternatively, a metrology device, such as metrology device 840, may be positioned on the bottom side of the reticle. Such a approach may be needed to facilitate practical considerations, such as space constraints within a lithographic apparatus. Additionally, such an approach may be necessary in extreme ultra-violet ("EUV") lithographic systems.

Air gauges are currently in operation on lithographic apparatus for leveling purposes on the wafer stage. With sufficient sampling time, an air gauge is able to resolve a surface measurement to a few nanometers. An array of such gauges (or by repositioning a single gauge) can be used to map a reticle surface with a resolution of a few nanometers relative to some calibrated reference surface, which could be a surface on the reticle chuck.

An optical sensor looking through the reticle glass at the reflection of a chrome pattern of the reticle can be made to work, thereby measuring the pattern surface directly. An optical sensor functions in a manner similar to a level sensor, except that it works through the glass down to the chrome layer. Similarly, an optical sensor could be used to look through the pellicle at the front side of the reticle.

An exemplary approach for using interferometric measuring beams for positioning that can be adapted for the use of mapping a reticle surface is described in U.S. Pat. No. 6,934,005, entitled Reticle Focus Measurement Method Using Multiple Interferometric Beams, which is incorporated herein in its entirety.

Figure 3:
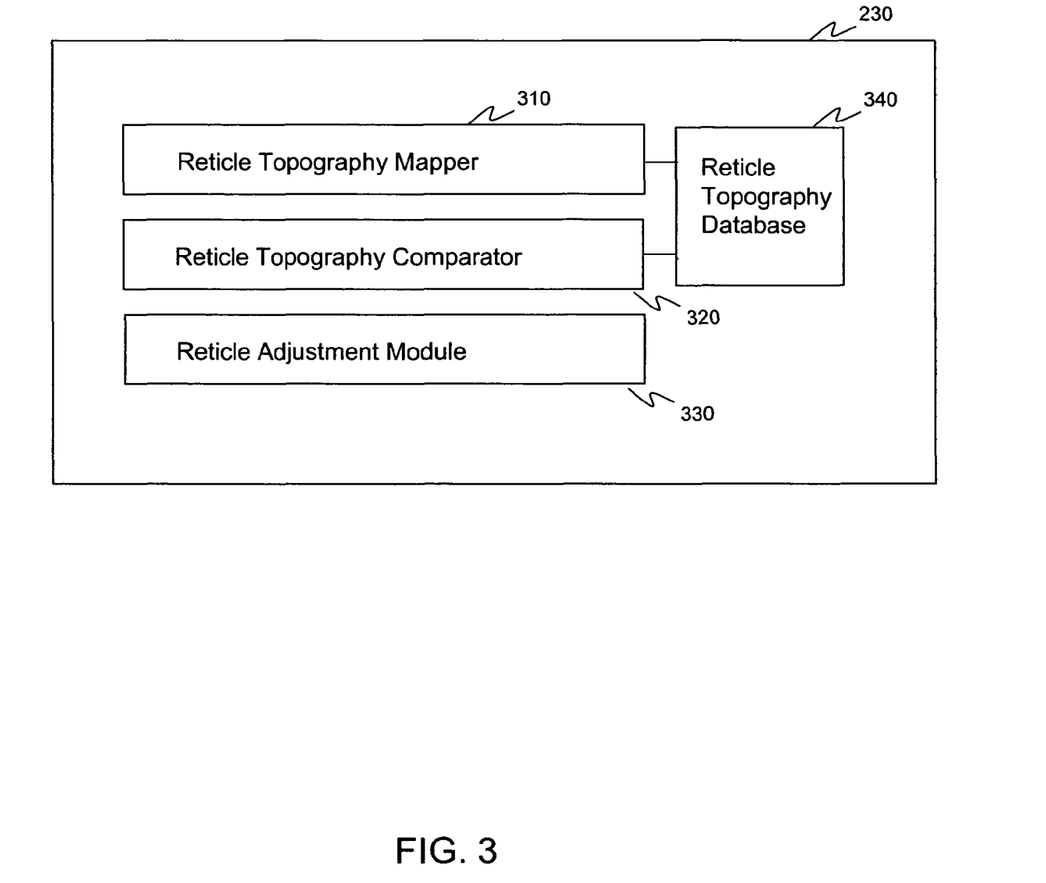
FIG. 3 provides a diagram of reticle inspection analyzer, according to an embodiment of the invention.

Reticle inspection analyzer 230 is illustrated in more detail in FIG. 3. Referring to FIG. 3, reticle inspection analyzer 230 includes reticle topography mapper 310, reticle topography comparator 320, reticle adjustment module 330, and reticle signature database 340.

Reticle topography mapper 310 generates topographical maps for a reticle based on measurements from mapping device 220, which can be in a standalone reticle inspection system or integrated within a lithographic apparatus, such as lithographic apparatus 100. Reticle topography mapper 310 can also generate a theoretical topographical map for a reticle based on design parameters for the reticle.

Reticle topography comparator 320 compares reticle topographies. In particular reticle topography comparator 320 can compare a topography of a reticle in a load-free state and a topography of the reticle in a loaded state. Upon completion of a topography comparison, reticle topography comparator 320 generates a signature for the reticle relative to the comparison topography (e.g., a signature relative to a theoretical topography or a signature relative to a load-free topography). A control action can be taken based on the comparison of the topography of the reticle in a load-free state and a topography of the reticle in a loaded state. Similarly, reticle topography comparator 320 can compare a theoretical topography of a reticle in a loaded state and a theoretical topography of the reticle. A control action can be taken based on the comparison of the theoretical topography of the reticle and a topography of the reticle in a loaded state.

Reticle adjustment module 330 determines the forces to apply to a reticle in a loaded state when adjustments to the loaded reticle need to be made. For example, adjustments are made to the reticle when the differences between the load-free reticle and loaded reticle topographies exceed an allowable threshold. In other embodiments, reticle adjustment module 330 determines adjustments that can be made to other modules of a lithographic apparatus based on a reticle topography. For example, a reticle signature can be decomposed into adjustments that can be made by other modules, such as the projection optics or wafer stage. In this approach, reticle adjustment modules 330 determines adjustments, such as lens adjustments and wafer stage adjustments based on the reticle signature.

Reticle topography database 340 stores topography signatures for reticle surfaces. The stored topographies can include reticle topographies for theoretical, load-free and loaded conditions. Reticle topography database 340 can also store signatures for a reticle relative to a specified baseline.

Figure 4:
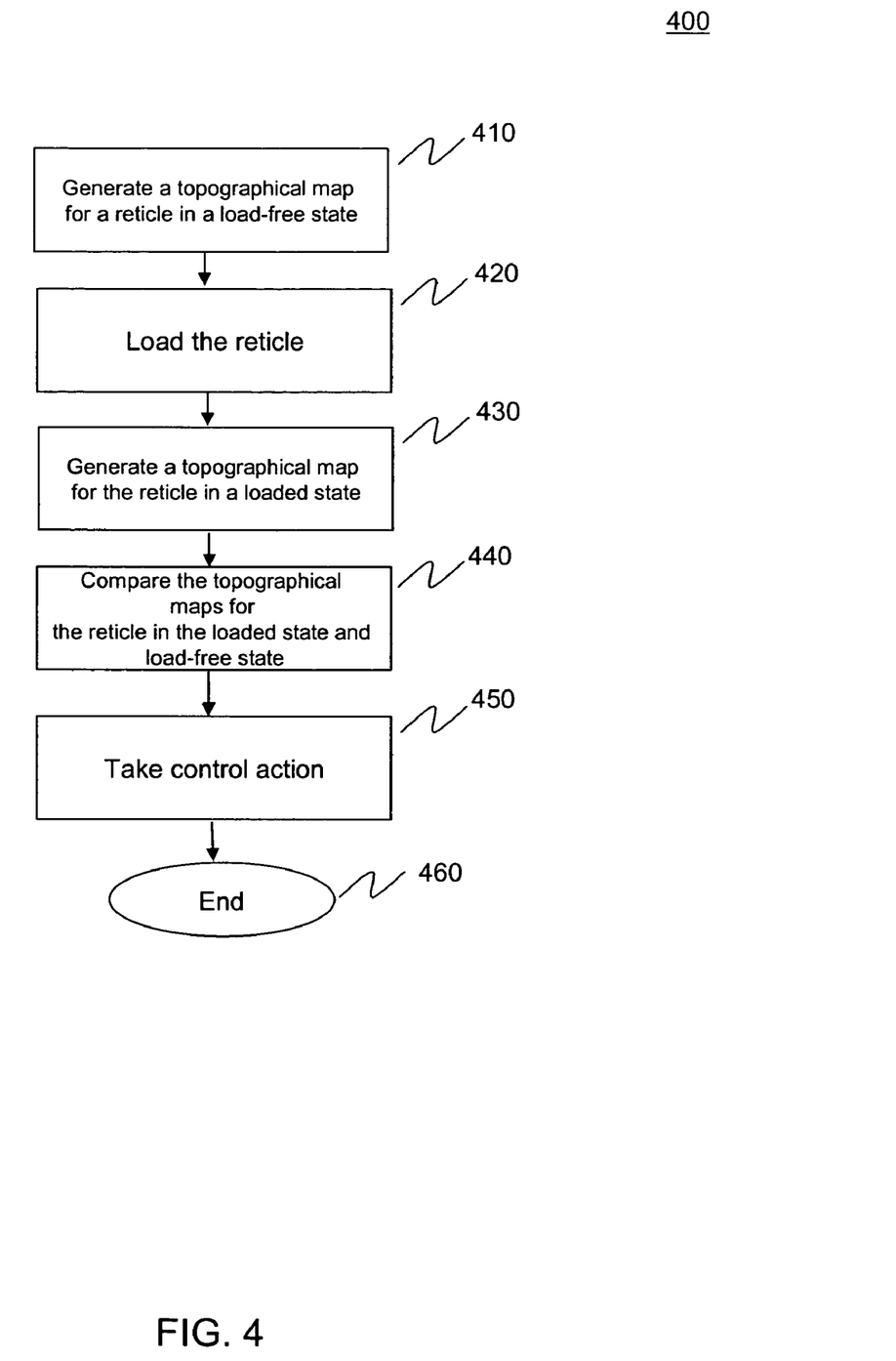
FIG. 4 provides a flowchart of a method for lithographic reticle inspection, according to an embodiment of the invention.

FIG. 4 provides a flowchart of method 400 for lithographic reticle inspection, according to an embodiment of the invention. Method 400 begins in step 410.

In step 410 a topographical map for a reticle surface in a load-free state is generated. In the load-free state the only loading on the reticle is that of gravity and the required reaction loads against gravity. For example, a mapping station that includes a reticle positioning device 210 and a reticle mapping device 220 determines a baseline or load-free topography map of the top surface of a reticle. The mapping station can be integrated into a lithographic apparatus, such as lithographic apparatus 100 or contained within a stand alone device.

Specifically, a topographical map of a reticle surface can be generated by using reticle mapping device 220, which can include but is not limited to an air gauge, an air gauge array, an optical sensor or an interferometer. In mapping the reticle surface either the entire surface can be mapped or a portion of the surface, such as only the active surface used for patterning of a substrate, can be mapped. Additionally, a topographical map can be generated for the clamped area of a reticle surface. With the presence of a pellicle, for example, a determination may be made to map an active area and the clamped areas. Alternatively, only a map of the areas outside the pellicle may be generated.

To position the reticle in a load-free state, the reticle can be supported with the use of reticle positioning device 210, which can include, but is not limited to, air bearings, a bed of springs, or a kinematic three point mount, similar to that used in a reticle writing e-beam system, as will be known by individuals skilled in the relevant arts.

When measuring the topography of the surface of a reticle, the chrome side of a reticle is down. A pellicle is typically coupled to the reticle and also is located on the chrome side. In an embodiment the reticle is constrained kinematically as depicted in FIG. 6.

Optionally, the topographic map generated can be compensated for due to sag due to gravitational forces. Using three points holding a reticle against gravity, for example, a baseline figure due to gravity sag can be determined. In particular, sag can be determined by calculation or by a system of measurements using either a perfectly flat reticle blank or with a reticle that is rotated and mapped up to four times in order to take out the reticle topography signature. In any case, the result is a baseline topographic map like the one depicted in FIG. 7A. FIG. 7A provides a baseline topography map 700 having topography patterns 705, 710, 715, and 720.

In step 420 a reticle is loaded into a lithographic apparatus. For example, the reticle can be loaded into a lithographic apparatus reticle chuck. FIG. 8 provides a diagram of a reticle 810 loaded into a lithographic apparatus, such as lithographic apparatus 100, Reticle 810 is shown held into place, for example, by reticle chucks 830. Pellicle 820 is also shown affixed to reticle 810.

Figure 7B:
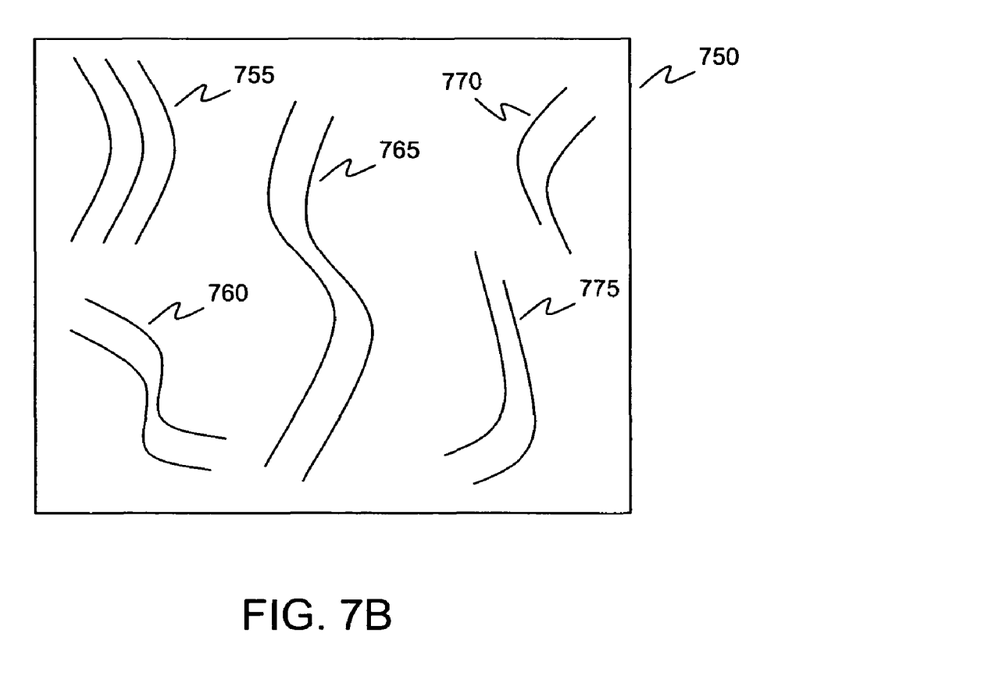
FIG. 7B provides a topographical map of a reticle surface in a loaded state, according to an embodiment of the invention.

In step 430 a topographical map for the reticle surface in the loaded state is generated, such as topographical map 750, which is shown in FIG. 7B. Topographical map 750 includes topography patterns 755, 760, 765, 770, and 775.

In step 440 the load-free reticle topographical map is compared to the loaded reticle topographical map to identify differences between the load-free reticle topographical map and the loaded reticle topographical map. The comparison generates a signature for the loaded reticle relative to the reticle in an unloaded state, which highlights differences between the topographies. Alternatively, a comparison can be made between the loaded reticle and a theoretical estimate of the topography for the reticle.

For example, a comparison of topography maps 700 and 750 can be made. A comparison highlights that some distortion has occurred. For example, topography patterns 710, 715 and 720 of topography map 700 are the same as topography patterns 765, 770, and 755, respectively, of topography map 750. However, on the left side of the topography pattern 705 of topography map 700 differs from topography pattern 755 and 760 of topography map 750, indicating that stress on the reticle has lead to changes in the surface of the reticle.

In step 450 a control action is taken based on the differences (or signature) between the load-free reticle topographical map and the loaded reticle topographical map. When the differences are less than a difference threshold, a determination is made that the loaded reticle is suitable for use. In an embodiment, the difference threshold is a predetermined tolerance that assures accurate printing of a wafer or other substrate. If the differences exceed a difference threshold, a control action to reject the use of the reticle can occur. Alternatively, a control action to apply forces to the reticle can occur. For example, are the differences in patterns 705 and patterns 755 and 760 large enough to trigger a control action to prevent use of the reticle or to trigger a control action to attempt to reshape the loaded reticle. If an attempt to reshape the loaded reticle appears feasible, forces can be applied to the reticle in an attempt to reshape the reticle to more closely match the loaded topography with that of the unloaded topography or theoretical topography. In this case, reticle adjustment module 330 calculates the forces necessary for application to the reticle based on analysis of the unloaded and loaded topographies of the reticle. In step 460 method 400 ends. Other control actions can be taken, as will be known to individuals skilled in the relevant arts based on the teachings herein.

In an embodiment, method 400 is conducted in situ during a wafer run.

In this case, the flow of a reticle through method 400 could be as follows. A reticle is obtained from a reticle pod (not shown) used for storing reticles. For example such a pod could be associated with lithographic apparatus 100. The reticle is placed on a calibration chuck in a reticle handler (also not shown), as will be known by individuals skilled in the relevant arts. The topography of the surface is mapped with a mapping device, such as for example, reticle mapping device 220, that can be integrated within the reticle handler. Next, the reticle is loaded into a reticle chuck. The topography of the reticle surface is measured using, for example, an array of air gauges that mount on the lens top with the rest of the reticle stage metrology hardware to provide the functionality of reticle mapping device 220. Once the two topography maps exist, a comparison is made to determine what type of control action should be taken.

Figure 5:
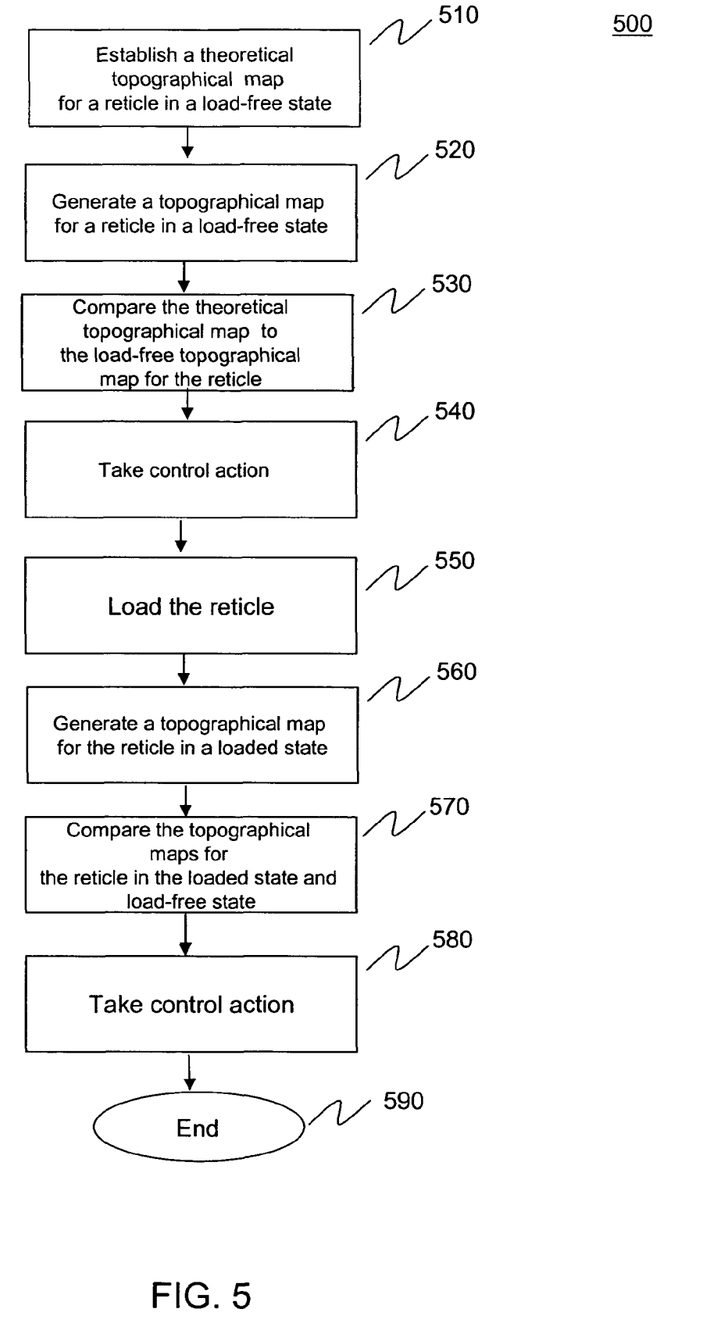
FIG. 5 provides a diagram of a method for lithographic reticle inspection, according to an embodiment of the invention.

FIG. 5 provides a flowchart of method 500 for lithographic reticle inspection, according to an embodiment of the invention. Method 500 is similar to method 400, except that method 500 also includes a comparison between a theoretical topographic map for a reticle and a topographic map for a reticle in a load free state to provide another level of quality validation. Method 500 begins in step 510.

In step 510, a theoretical topography is generated for a reticle in a load-free state. This theoretical signature is based on the reticle design and not physical measurements of the reticle.

In step 520 a topographical map for a reticle surface in a load-free state is generated. In the load-free state the only loading on the reticle is that of gravity and the required reaction loads against gravity. For example, a mapping station that includes a reticle positioning device 210 and a reticle mapping device 220 determines a baseline or load-free topography map of the top surface of a reticle. This step is similar to step 410 in method 400.

In step 530 the theoretical topographic map and the load-free topographic map are compared. By mathematically subtracting out the theoretical map from the load-free map, the reticle signature can be determined. This is related to the taper, non flatness, wedge, overall thickness variation and state of internal stress of the reticle. All are constants and are present at the time of writing, inspecting and using the reticle.

In step 540 a control action is taken. For example, if the differences between the theoretical topography and the load-free topography exceed a preset threshold, the control action to reject the reticle can be taken. Otherwise a control action to adjust the reticle or to simply proceed to use the reticle, as is, can be taken.

In step 550 the reticle is loaded into a lithographic apparatus.

In step 560 a topographical map for the reticle surface in the loaded state is generated, such as topographical map 750, which is shown in FIG. 7B. Topographical map 750 includes topography patterns 755, 760, 765, 770, and 775.

In step 570 the load-free reticle topographical map is compared to the loaded reticle topographical map to identify differences between the load-free reticle topographical map and the loaded reticle topographical map. The comparison generates a signature for the loaded reticle relative to the reticle in an unloaded state that highlights differences between the topographies. Alternatively, a comparison can be made between the loaded reticle and a theoretical estimate of the topography for the reticle.

In step 580 a control action is taken based on the differences (or signature) between the load-free reticle topographical map and the loaded reticle topographical map. When the differences are less than a difference threshold a determination is made that the loaded reticle is suitable for use. In an embodiment, the difference threshold is a predetermined tolerance that assures accurate printing of a wafer or other substrate. If the differences exceed a difference threshold, a control action to reject the use of the reticle can occur. Alternatively, a control action to apply forces to the reticle can occur. For example, are the differences in patterns 705 and patterns 755 and 760 large enough to trigger a control action to prevent use of the reticle or to trigger a control action to attempt to reshape the loaded reticle. If an attempt to reshape the loaded reticle appears feasible, forces can be applied to the reticle in an attempt to reshape the reticle to more closely match the loaded topography with that of the unloaded topography or theoretical topography. In this case, reticle adjustment module 330 calculates the forces necessary for application to the reticle based on analysis of the unloaded and loaded topographies of the reticle. In step 590 method 400 ends.

In an embodiment, method 500 is conducted in situ during a wafer run by lithographic apparatus 100.

Computer System Implementation

Figure 9:
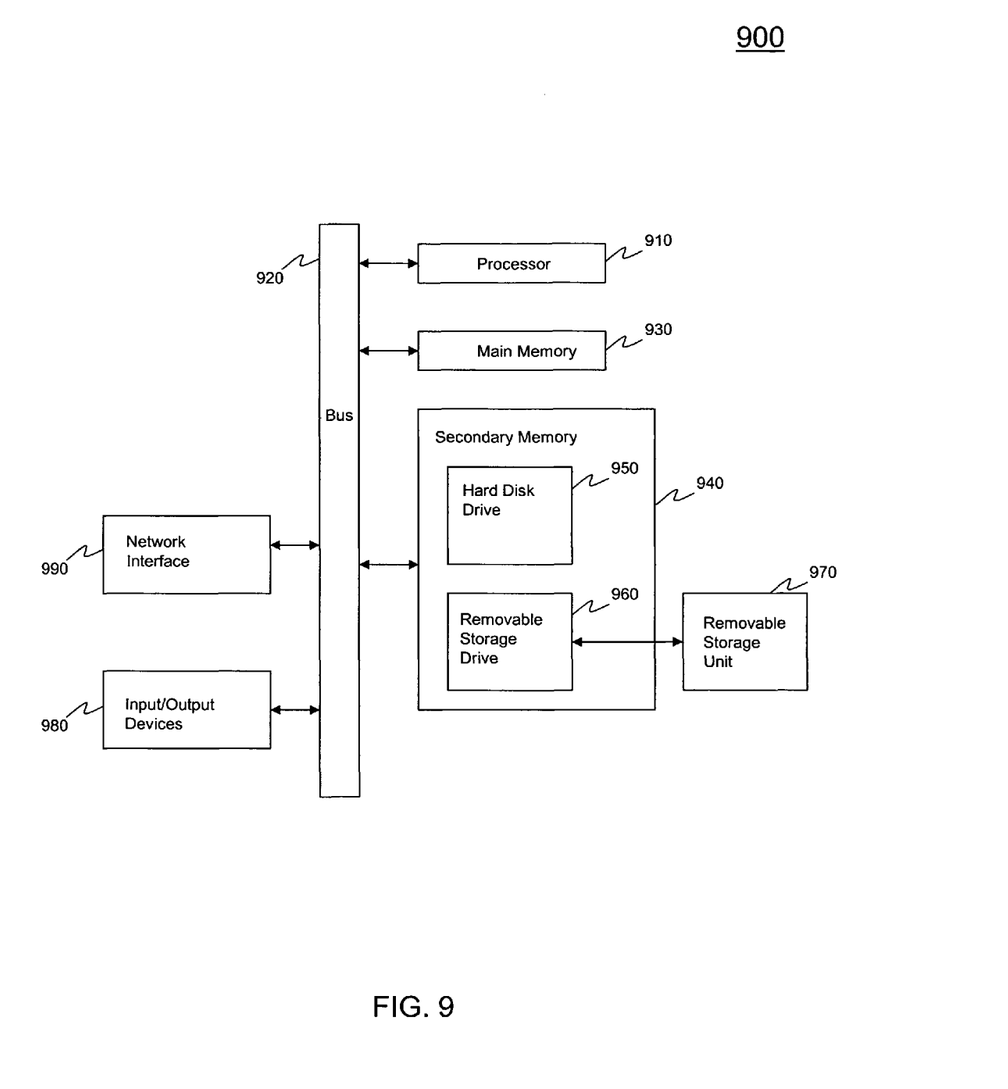
FIG. 9 provides a diagram of a computer system.

In an embodiment of the present invention, the methods and systems of the present invention described herein are implemented using well known computers, such as a computer 900 shown in FIG. 9. In particular, all or portions of reticle topography mapper 310, reticle topography comparator 320, reticle adjustment module 330 and reticle topography database 340 can be implemented using well known computers or computing systems. The computer 900 can be any commercially available and well known computer or server capable of performing the functions described herein, such as computers available from International Business Machines, Apple, Sun, HP, Dell, Cray, etc.

Computer 900 includes one or more processors (also called central processing units, or CPUs), such as processor 910. Processor 900 is connected to communication bus 920. Computer 900 also includes a main or primary memory 930, preferably random access memory (RAM). Primary memory 930 has stored therein control logic (computer software), and data.

Computer 900 may also include one or more secondary storage devices 940. Secondary storage devices 940 include, for example, hard disk drive 950 and/or removable storage device or drive 960. Removable storage drive 960 represents a floppy disk drive, a magnetic tape drive, a compact disk drive, an optical storage device, tape backup, ZIP drive, JAZZ drive, etc.

Removable storage drive 960 interacts with removable storage unit 970. As will be appreciated, removable storage unit 960 includes a computer usable or readable storage medium having stored therein computer software (control logic) and/or data. Removable storage drive 960 reads from and/or writes to the removable storage unit 970 in a well known manner.

Removable storage unit 970, also called a program storage device or a computer program product, represents a floppy disk, magnetic tape, compact disk, optical storage disk, ZIP disk, JAZZ disk/tape, or any other computer data storage device. Program storage devices or computer program products also include any device in which computer programs can be stored, such as hard drives, ROM or memory cards, etc.

In an embodiment, the present invention is directed to computer program products or program storage devices having software that enables computer 900, or multiple computer 900s to perform any combination of the functions described herein Computer programs (also called computer control logic) are stored in main memory 930 and/or the secondary storage devices 940. Such computer programs, when executed, direct computer 900 to perform the functions of the present invention as discussed herein. In particular, the computer programs, when executed, enable processor 910 to perform the functions of the present invention. Accordingly, such computer programs represent controllers of the computer 900.

Computer 900 also includes input/output/display devices 980, such as monitors, keyboards, pointing devices, etc.

Computer 900 further includes a communication or network interface 990. Network interface 990 enables computer 900 to communicate with remote devices. For example, network interface 990 allows computer 900 to communicate over communication networks, such as LANs, WANs, the Internet, etc. Network interface 990 may interface with remote sites or networks via wired or wireless connections. Computer 900 receives data and/or computer programs via network interface 990. The electrical/magnetic signals having contained therein data and/or computer programs received or transmitted by the computer 900 via interface 990 also represent computer program product(s).

The invention can work with software, hardware, and operating system implementations other than those described herein. Any software, hardware, and operating system implementations suitable for performing the functions described herein can be used.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A method for lithographic reticle inspection, comprising:
   (a) generating a three-dimensional topographical map for a reticle surface, wherein a reticle is in a load-free state;
   (b) loading the reticle;
   (c) generating a three-dimensional topographical map for the reticle surface, wherein the reticle is in a loaded state;
   (d) comparing the load-free reticle three-dimensional topographical map to the loaded reticle three-dimensional topographical map to identify differences between the load-free reticle three-dimensional topographical map and the loaded reticle three-dimensional topographical map; and
   (e) taking a compensating control action based on the differences between the load-free reticle three-dimensional topographical map and the loaded reticle three-dimensional topographical map.

2. The method of claim 1, wherein the generating the three-dimensional topographical map for the reticle surface comprises using an air gauge, an air gauge array, an optical sensor or an interferometer.

3. The method of claim 1, wherein the generating the three-dimensional topographical map for the reticle surface includes mapping the entire surface of the reticle surface.

4. The method of claim 1, wherein the generating the three-dimensional topographical map for the reticle surface includes mapping the active surface of the reticle surface, mapping a clamped area of the reticle surface, or mapping a portion of the reticle surface.

5. The method of claim 1, further comprising supporting the reticle in the load-free state on an air bearing, on a bed of springs or on a kinematic three point mount.

6. The method of claim 1, further comprising compensating the topographical map for the reticle surface in the load-free state for sag due to gravity.

7. The method of claim 1, wherein the loading the reticle includes placing the reticle in a lithographic apparatus reticle chuck.

8. The method of claim 1, wherein the control action includes rejecting use of the reticle.

9. The method of claim 1, wherein the control action includes applying force to the reticle to adjust the reticle topography to more closely match the topography of the load-free reticle topography.

10. A lithographic reticle inspection system, comprising:
    a reticle positioning device that positions a reticle;

a mapping device that maps a three-dimensional topography of a reticle surface;

a reticle topography mapper that generates a three-dimensional topographical map for the reticle based on measurements from the mapping device; and a reticle topography comparator that compares a three-dimensional topography of the reticle in a load-free state to a three-dimensional topography of the reticle in a loaded state, wherein a compensating control action is taken based on the comparison of the three-dimensional topography of the reticle in the load-free state and the three-dimensional topography of the reticle in the loaded state.

11. The lithographic reticle inspection device of claim 10, further comprising a reticle topography database that stores at least one of topography maps and topography signatures for reticle surfaces.

12. The lithographic reticle inspection system of claim 10, wherein the mapping device includes an air gauge, an air gauge array, an optical sensor or an interferometer.

13. The lithographic reticle inspection system of claim 10, wherein the reticle positioning device includes an air bearing, a bed of springs, or kinematic three point mount.

14. A reticle inspection analyzer embedded in a non-transitory computer readable medium, comprising:

a reticle topography mapper that generates a three-dimensional topography for the reticle based on measurements from a reticle mapping device; and a reticle topography comparator that compares a three-dimensional topography of a reticle in a load-free state to a three-dimensional topography of the reticle in a loaded state, wherein a compensating control action is taken based on the comparison of the three-dimensional topography of the reticle in the load-free state and the three-dimensional topography of the reticle in the loaded state.

15. The reticle inspection analyzer of claim 14, further comprising a reticle signature database that stores topography signatures for reticle surfaces.

16. The reticle inspection analyzer of claim 14, further comprising a reticle adjustment module that determines a control action to modify a reticle topography.

17. The reticle inspection analyzer of claim 16, wherein the control action includes applying force to the reticle to adjust the reticle topography.

18. The reticle inspection analyzer of claim 16, wherein the control action includes adjusting a lithographic apparatus adjustment based on the three-dimensional reticle topography.

19. The reticle inspection analyzer of claim 18, wherein the lithographic apparatus adjustment includes at least one of making a lens adjustment and a wafer stage adjustment.

* * * * *